US009548155B2

(12) United States Patent
Andersson et al.

(10) Patent No.: US 9,548,155 B2
(45) Date of Patent: Jan. 17, 2017

(54) TRANSFORMER FILTER ARRANGEMENT

(75) Inventors: Stefan Andersson, Lund (SE); Fenghao Mu, Hjärup (SE); Johan Wernehag, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 64 days.

(21) Appl. No.: 14/233,063

(22) PCT Filed: Jul. 10, 2012

(86) PCT No.: PCT/SE2012/050823
§ 371 (c)(1),
(2), (4) Date: Mar. 17, 2014

(87) PCT Pub. No.: WO2013/012383
PCT Pub. Date: Jan. 24, 2013

(65) Prior Publication Data
US 2014/0266506 A1 Sep. 18, 2014

Related U.S. Application Data

(60) Provisional application No. 61/512,086, filed on Jul. 27, 2011.

(30) Foreign Application Priority Data

Jul. 21, 2011 (EP) ..................... 11174819

(51) Int. Cl.
*H01F 29/02* (2006.01)
*H01F 27/42* (2006.01)
(Continued)

(52) U.S. Cl.
CPC ............ *H01F 29/02* (2013.01); *H01F 27/343* (2013.01); *H01F 27/42* (2013.01); *H03H 7/0115* (2013.01);
(Continued)

(58) Field of Classification Search
CPC .... H01F 27/42; H01F 27/343; H01F 27/2804; H01F 38/14; H01F 29/02; H01F 29/025; H03H 7/09; H03H 7/38; H03H 7/42; H03H 7/0115; H03H 7/427
(Continued)

(56) References Cited

U.S. PATENT DOCUMENTS 5,285,179 A 2/1994 Wignot et al.
6,861,922 B2 * 3/2005 Hasegawa .................... 333/24.2
(Continued)

FOREIGN PATENT DOCUMENTS

| CH | 275245 A | 5/1951 |
| EP | 0257291 A1 | 3/1988 |
| EP | 0539133 B1 | 3/1997 |

OTHER PUBLICATIONS

Yu et al, "Integrated multi-tap transformer for reconfigurable multimode matching networks", May 2011, IEEE, Circuit and Systems (ISCAS), p. 1395-1398.*

*Primary Examiner* — Benny Lee
*Assistant Examiner* — Albens Dieujuste
(74) *Attorney, Agent, or Firm* — Murphy, Bilak & Homiller, PLLC

(57) ABSTRACT

A transformer filter arrangement (30) for passing signals at a fundamental frequency and suppressing signals at one or more interfering frequencies is disclosed. It comprises a transformer (100) having a first winding (110) and a second winding (120), wherein the first winding (110) has a first end (112a) and a second end (122b) and the second winding (120) has a first end (122a) and a second end (122b). It further comprises one or more capacitors (130a-e). For each capacitor (130a-c) of a first set of at least one capacitor of the one or more capacitors (130a-e), the capacitor (130a-c) is connected between a pair of taps (a1, a2; b1, b2; c1, c2) of the first winding (110), wherein each tap (a1, a2, b1, b2, (Continued)

c1, c2) of the pair of taps (a1, a2; b1, b2; c1, c2) is located between the first end (112a) and the second end (112b) of the first winding (110), and the capacitor (130a-c), together with an inductive sub segment (140a-c) of the first winding (110), which is connected in parallel with the capacitor (130a-c) between the pair of taps (a1, a2; b1, b2; c1, c2), forms a parallel LC circuit which is tuned to resonate at one of said interfering frequencies for suppressing signals at said one of the interfering frequencies. A corresponding integrated circuit, a corresponding radio receiver circuit, a corresponding radio transmitter circuit, and a corresponding radio communication apparatus are also disclosed.

29 Claims, 5 Drawing Sheets

(51) Int. Cl.
| | | |
|---|---|---|
| *H01F 27/34* | (2006.01) | |
| *H03H 7/01* | (2006.01) | |
| H03H 7/09 | (2006.01) | |
| H03H 7/38 | (2006.01) | |
| H03H 7/42 | (2006.01) | |
| H01F 27/28 | (2006.01) | |
| H03H 1/00 | (2006.01) | |

(52) U.S. Cl.
CPC ............ *H01F 27/2804* (2013.01); *H03H 7/09* (2013.01); *H03H 7/38* (2013.01); *H03H 7/42* (2013.01); *H03H 7/427* (2013.01); *H03H 2001/0078* (2013.01); *H03H 2007/013* (2013.01)

(58) Field of Classification Search
USPC ........................... 333/12, 24 C, 25, 175, 177
See application file for complete search history.

(56) References Cited

U.S. PATENT DOCUMENTS

| | | | |
|---|---|---|---|
| 2001/0054937 A1* | 12/2001 | Hyvonen et al. | ................ 333/32 |
| 2005/0104679 A1* | 5/2005 | Blednov | ......................... 333/32 |
| 2006/0270377 A1 | 11/2006 | Bhatti et al. | |
| 2006/0273870 A1 | 12/2006 | Yeung et al. | |
| 2009/0195324 A1 | 8/2009 | Li et al. | |
| 2010/0026411 A1 | 2/2010 | Liu et al. | |
| 2010/0136942 A1 | 6/2010 | Lee et al. | |
| 2010/0194280 A1 | 8/2010 | Kirchmeier et al. | |

\* cited by examiner

TRANSFORMER FILTER ARRANGEMENT

TECHNICAL FIELD

The present invention relates to a transformer filter arrangement, which may be integrated on an integrated circuit, such as a transformer filter arrangement for use in a radio receiver circuit or a radio transmitter circuit.

BACKGROUND

Due to the deployment of more and more frequency bands for cellular radio-communications applications, the complexity of radio front-end circuitry to be used in such applications increases. Normally, at least one relatively expensive external (or "off-chip") filter, usually a SAW (Surface Acoustic Wave) filter, has to be used for each frequency band to be received with the cellular radio. Therefore the size and cost of the external front-end components increase when introducing new frequency bands. Striving towards more flexible front-end solutions requires new circuit solutions that can handle strong interferers and prevent harmonic down-conversion without sacrificing any other performance.

It is thus desirable to provide radio front-end circuitry that eliminates the need for at least some of the off-chip filters, e.g. relatively expensive SAW filters, that are normally used in present cellular radio communications circuitry, or that at least relaxes the requirements on such off-chip filters, which in turn facilitates a reduction of manufacturing cost.

US 2009/0195324 A1 discloses an electronic assembly that includes a substrate, a balun transformer formed on the substrate and including a first winding and a second winding and a reaction circuit component formed on the substrate and connected between a center tap of the second winding and ground. The balun transformer and the reaction circuit component jointly form a harmonically suppressed balun transformer having a fundamental frequency, and the reaction circuit component is tuned such that the harmonically suppressed balun transformer resonates at the second harmonic of the fundamental frequency.

SUMMARY

According to a first aspect, there is provided a transformer filter arrangement for passing signals at a fundamental frequency and suppressing signals at one or more interfering frequencies for use in a receiver circuit or a transmitter circuit. The transformer filter arrangement comprises a transformer having a first winding and a second winding formed by conducting and isolating layers of a chip or printed circuit board. The first winding has a first end and a second end and the second winding has a first end and a second end. The transformer filter arrangement further comprises one or more capacitors. For each capacitor of a first set of at least one capacitor of the one or more capacitors, the capacitor is connected between a pair of taps of the first winding, wherein each tap of the pair of taps is located between the first end and the second end of the first winding, and the capacitor, together with an inductive sub segment of the first winding, which is connected in parallel with the capacitor between the pair of taps, forms a parallel LC circuit which is tuned to resonate at one of said interfering frequencies for suppressing signals at said one of the interfering frequencies.

The first set of capacitors may comprise a plurality of capacitors.

In some embodiments, there may be a second set of at least one capacitor of the one or more capacitors. For each capacitor in the second set, the capacitor may be connected between a pair of taps of the second winding, wherein each tap of the pair of taps may be located between the first end and the second end of the second winding, and the capacitor, together with an inductive sub segment of the second winding, which may be connected in parallel with the capacitor between the pair of taps, may form a parallel LC circuit which may be tuned to resonate at one of said interfering frequencies for suppressing signals at said one of the interfering frequencies. The first set and the second set may be disjoint.

In some embodiments, each capacitor of the one or more capacitors may belong to the first set. In some embodiments, each capacitor of the one or more capacitors may belong to the union of the first set and the second set.

The second set may comprise one or more symmetrically-connected sets of at least one capacitor, wherein, for each such symmetrically-connected set, all capacitors of the symmetrically-connected set have the same capacitance, and the capacitors of the symmetrically connected set are distributed symmetrically along the second winding.

Similarly, the first set may comprise one or more symmetrically-connected sets of at least one capacitor, wherein, for each such symmetrically-connected set, all capacitors of the symmetrically-connected set have the same capacitance, and the capacitors of the symmetrically connected set are distributed symmetrically along the first winding.

In some embodiments, each of the one or more capacitors may belong to a symmetrically-connected set.

Said one or more interfering frequencies may include one or more harmonics of the fundamental frequency. The one or more harmonics may include one or more odd order harmonics. The one or more odd order harmonics may include the third harmonic.

The transformer filter arrangement may have a notch-filter characteristic with notches at the one or more harmonic frequencies.

The transformer filter arrangement may further comprise one or more filtering circuits connected to one or more ends of the first and/or the second winding.

The transformer filter arrangement may be a balun arrangement, and the transformer may be a balun transformer.

According to a second aspect, there is provided an integrated circuit comprising the transformer filter arrangement according to the first aspect.

According to a third aspect, there is provided a radio receiver circuit comprising the transformer filter arrangement according to the first aspect.

According to a fourth aspect, there is provided a radio transmitter circuit comprising the transformer filter arrangement according to the first aspect.

According to a fifth aspect, there is provided a radio communication apparatus comprising the integrated circuit according to the second aspect, the radio receiver circuit according to the third aspect, and/or the radio transmitter circuit according to the fourth aspect. The radio communication apparatus may e.g. be, but is not limited to, a wireless data modem, a mobile telephone, or a radio base station.

Further embodiments are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
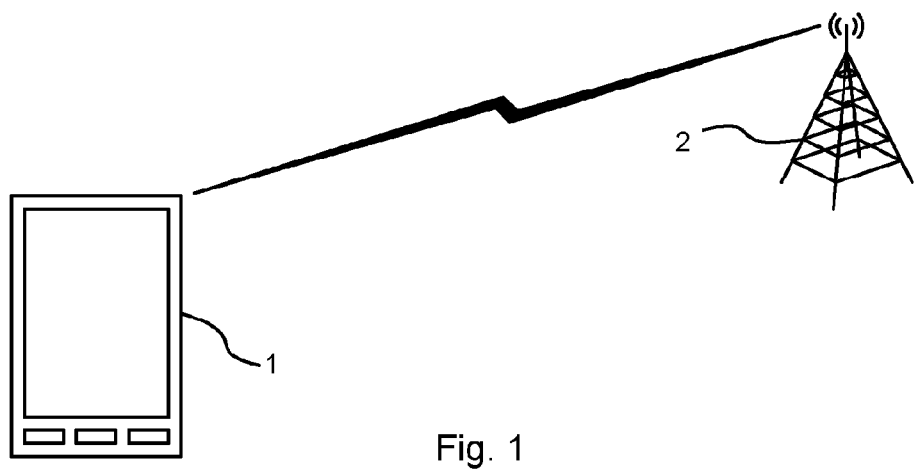
FIG. 1 schematically illustrates a mobile terminal in communication with a radio base station.

FIG. 1 illustrates schematically an environment in which embodiments of the present invention may be employed. In FIG. 1, a mobile terminal 1, illustrated in FIG. 1 as a mobile, or cellular, telephone 1, is in wireless communication with a radio base station 2, e.g. in a cellular communication network. The mobile telephone 1 and the radio base station 2 are nonlimiting examples of what is referred to below generically with the term radio communication apparatus. Another nonlimiting example of such a radio communication apparatus is a wireless data modem, e.g. a wireless data modem to be used in a cellular communication network. Embodiments of the present invention may also be employed in radio communication apparatuses for operation in other types of communication networks, such as but not limited to wireless local area networks (WLANs) and personal area networks (PANs).

Such radio communication apparatuses may comprise one or more radio receiver circuits and/or one or more radio transmitter circuits. Examples of such radio receiver and transmitter circuits are briefly described below with reference to FIG. 2 and FIG. 3, respectively.

Figure 2:
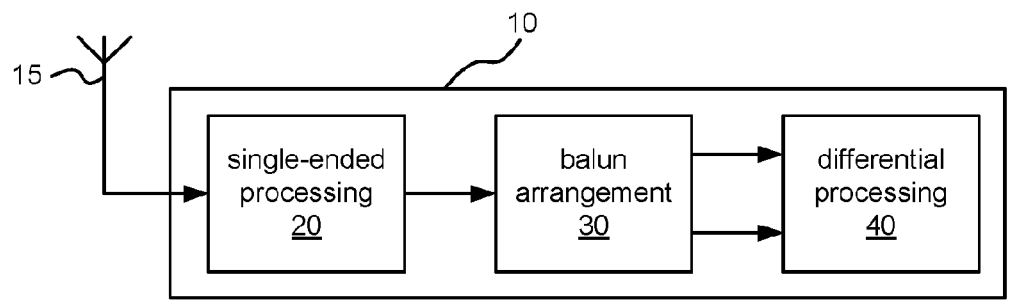
FIG. 2 is a simplified block diagram of a radio receiver circuit.

FIG. 2 is a simplified block diagram of a radio receiver circuit 10 according to an embodiment of the present invention. In FIG. 2, the radio receiver circuit 10 is connected to an antenna 15 for receiving electromagnetic radio frequency (RF) signals. Although a single antenna 15 is shown in FIG. 2, multiple antennas may well be used in other embodiments. In the embodiment illustrated in FIG. 2, the radio receiver circuit comprises single-ended processing circuitry 20 for operative connection to the antenna 15. The single-ended processing circuitry 20 is adapted to perform single-ended (analog) signal processing on a single ended signal from the antenna 15. Normally, it is beneficial e.g. in terms of suppression of noise and even-order distortion, to employ differential signal processing in the analog domain. To enable the use of differential signal processing, the radio receiver circuit 10 comprises a balun (balanced/unbalanced) arrangement 30 operatively connected to the circuitry 20 and adapted to convert a single-ended, or unbalanced, output signal of the single-ended processing circuitry 20 to a differential, or balanced, signal representation. The radio receiver circuit 10 further comprises differential processing circuitry 40 operatively connected to the balun arrangement 30. The differential processing circuitry 40 is adapted to perform differential (analog) signal processing on the differential output signal from the balun arrangement 30. The single-ended processing circuitry 20 and the differential processing circuitry 40 may comprise circuitry such as amplifiers, e.g. one or more variable gain amplifiers (VGAs) and/or one or more low noise amplifiers (LNAs), filters, buffers, mixers etc. that are normally used in radio receiver circuits. The design of such circuitry per se is well known in the art and therefore not further described herein. The radio receiver circuit 10 may further comprise one or more analog-to-digital converters (ADCs, not shown in FIG. 2) for converting analog signals in the radio receiver circuit 10 to digital signals. Furthermore, the radio receiver circuit 10 may also comprise digital signal processing (DSP) circuitry (not shown in FIG. 2), such as a digital baseband processor or the like, for processing of said digital signals. The design of such ADCs and/or DSP circuitry, as well as their inclusion in radio receiver circuits, per se are well known in the art and therefore not further described herein. The single-ended processing circuitry 20, the balun arrangement 30, and the differential processing circuitry 40 may be advantageously integrated on the same integrated circuit chip.

Figure 3:
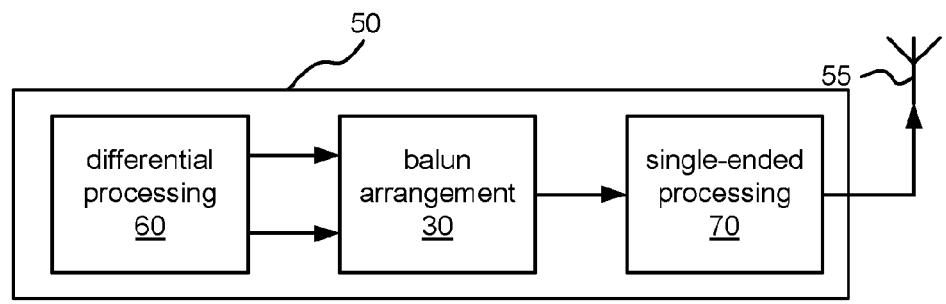
FIG. 3 is a simplified block diagram of a radio transmitter circuit.

FIG. 3 is a simplified block diagram of a radio transmitter circuit 50 according to an embodiment of the present invention. In FIG. 3, the radio transmitter circuit 50 is connected to an antenna 55 for transmitting electromagnetic RF signals. Although a single antenna 55 is shown in FIG. 3, multiple antennas may well be used in other embodiments. In the embodiment illustrated in FIG. 3, the radio transmitter circuit 50 comprises differential processing circuitry 60 adapted to perform differential (analog) signal processing on signals representing data to be transmitted by the radio transmitter circuit 50. Furthermore, in the embodiment illustrated in FIG. 3, the radio transmitter circuit 50 comprises single-ended processing circuitry 70 for operative connection to the antenna 55. The single-ended processing circuitry 70 is adapted to perform single-ended (analog) signal processing on signals representing data to be transmitted by the radio transmitter circuit 50 via the antenna 55. Moreover, according to the embodiment illustrated in FIG. 3, the radio transmitter circuit 50 comprises a balun arrangement 30 operatively connected between the differential processing circuitry 60 and the single-ended processing circuitry 70. The balun arrangement 30 is arranged to convert a differential, or balanced, output signal of the differential processing circuitry 60 to a single-ended, or unbalanced, representation to be input to the single-ended processing circuitry 70. The use of the same reference number 30 for the balun arrangement in both FIG. 2 and FIG. 3 is not an indicator that a single common balun arrangement is shared between the radio receiver circuit 10 and the radio transmitter circuit 50. Rather, it is an indication that embodiments of the balun arrangement 30 may be employed in radio receiver circuits, such as the radio receiver circuit 10, as well as in radio transmitter circuits, such as the radio transmitter circuit 50. The single-ended processing circuitry 70 and the differential processing circuitry 60 may comprise circuitry such as amplifiers, e.g. one or more VGAs and/or one or more power amplifiers (PAs), filters, buffers, mixers etc. that are normally used in radio transmitter circuits. The design of such circuitry per se is well known in the art and therefore not further described herein. Furthermore, the radio transmitter circuit 50 may also comprise DSP circuitry (not shown in FIG. 3), such as a digital baseband processor or the like, for processing and generating digital signals representing data to be transmitted by the radio transmitter circuit 50. The radio transmitter circuit 50 may further comprise one or more digital-to-analog converters (DACs, not shown in FIG. 3) for converting such digital signals to analog signals to be processed by the differential processing circuitry 60 and the single-ended signal processing circuitry 70. The design of such DACs and/or DSP circuitry, as well as their inclusion in radio transmitter circuits, per se are well known in the art and therefore not further described herein. The differential processing circuitry 60, the balun arrangement 30, and the single-ended processing circuitry 70 may be advantageously integrated on the same integrated circuit chip.

The inventors have realized that filtering to some extent can be advantageously merged with, or included in, the balun arrangement 30, e.g. as is further elucidated in the context of embodiments. Thereby, the requirements on off-chip filters may be reduced, and in some embodiments, the need for one or more such off-chip filters, such as a SAW filter, may even be eliminated. As is further elucidated below, embodiments of the present invention may provide for filtering at a relatively small circuit area overhead compared with a "normal" balun arrangement (without such filtering). In many case, such a "normal" balun arrangement would be present anyway in a radio receiver circuit or a radio transmitter circuit. Thus, in some embodiments, such filtering may be introduced in the radio receiver circuit 10 or radio transmitter circuit 50 at a relatively small circuit area overhead.

The balun arrangement 30 considered in embodiments of the present invention is of the type comprising a transformer with a primary and a secondary winding that are electro-magnetically coupled to each other. Each winding has a terminal at each end. On the differential, or balanced, side of a transformer used in such a balun arrangement, both terminals of the corresponding winding are used for signal input or output, as the case may be. On the single-ended, or unbalanced, side of the transformer, only one of the terminals of the corresponding winding is used for signal output/input, whereas the other terminal is connected to a reference voltage, such as ground or signal ground. The structures used in various embodiments can be used in other transformer arrangements than balun arrangements as well, such as a fully differential transformer arrangement where both terminals of both windings are used for signal input/output, or a fully single-ended transformer arrangement where only one terminal per winding is used for signal input/output, whereas the other terminal of each winding is connected to a reference voltage, such as ground or signal ground. Therefore, in order to accommodate such other transformer arrangements as well, the more generic term transformer filter arrangement 30 is used below instead of balun arrangement 30 (which is a special case of a transformer filter arrangement 30). Embodiments of the transformer filter arrangement 30 described herein are suitable for integrated circuit integration, i.e. are suitable for integration on an integrated circuit chip, which facilitates miniaturization. The transformer filter arrangement may e.g. either be implemented on the same chip as other radio transmitter and/or receiver components, or be implemented on a separate piece of substrate from such other radio transmitter and/or receiver components that may be included in the same integrated circuit package as the chip (or possibly chips) comprising such other radio transmitter and/or receiver components. In some embodiments, the transformer filter arrangement may also be implemented off chip, e.g. utilizing the conducting layers of a printed circuit board, or the like. Thus, the transformer can be considered to be a planar transformer implemented by interleaved or stacked topology, where the windings in interleaved topology are placed in the same conducting layer with vias interconnecting the winding parts to close the winding loops, and the windings in the stacked topology are placed in adjacent conducting layers covering substantially the same chip or substrate area. According to embodiments of the present invention, the transformer filter arrangement is configured to pass signals at a fundamental frequency and to suppress signals at one or more interfering frequencies. Thus, the signals at the fundamental frequency and the signals at the interfering frequency or frequencies are components of a radio frequency signal provided to either of the windings of a transformer of the transformer arrangement.

Figure 4:
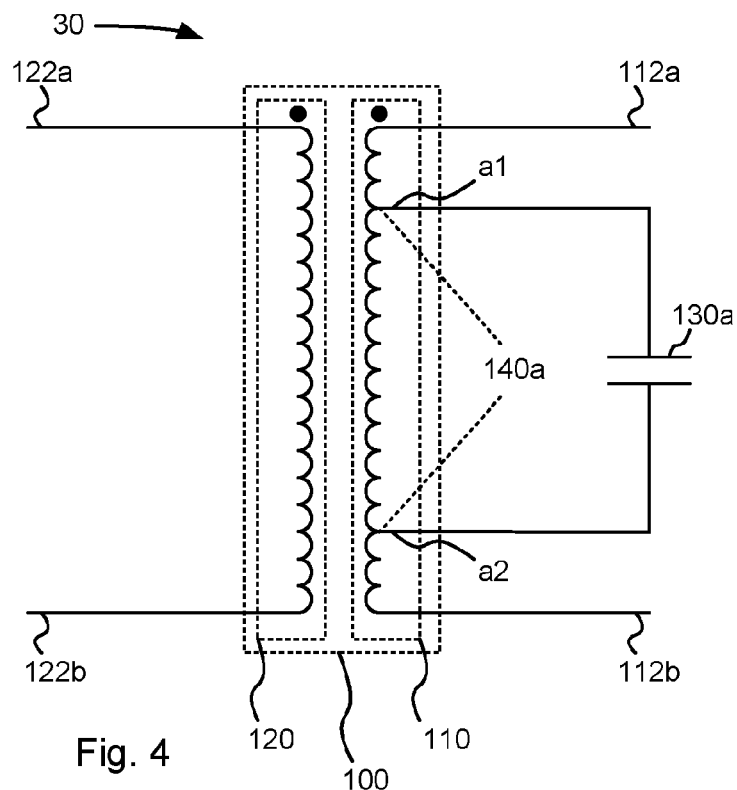
FIGS. 4-7 show schematic circuit diagrams of transformer filter arrangements according to embodiments of the present invention.

FIG. 4 is a schematic circuit diagram of the transformer filter arrangement 30 according to an embodiment of the present invention. According to the embodiment, the transformer filter arrangement 30 comprises a transformer 100 having a first winding 110 and a second winding 120. In the special case of a balun arrangement, the transformer 100 would be a balun transformer 100. In some embodiments, the first winding 110 is a primary winding of the transformer 100 and the second winding 120 is a secondary winding of the transformer 100. In other embodiments, it is the other way around, i.e. the first winding 110 is a secondary winding of the transformer 100 and the second winding 120 is a primary winding of the transformer 100. Each of the first winding 110 and the second winding 120 has one or more winding turns. The first winding 110 has (input/output) terminals 112a and 112b at its ends. The terms "ends 112a and 112b" and "terminals 112a and 112b" are used interchangeably in this specification. Similarly, the second winding 120 has (input/output) terminals 122a and 122b at its ends. The terms "ends 122a and 122b" and "terminals 122a and 122b" are used interchangeably in this specification.

According to embodiments of the present invention, the transformer filter arrangement comprises one or more capacitors, which are referred to in the following with the reference sign 130J, where J is a parameter representing any non-capital letter. It should be noted that integrated capacitors are typically much smaller in size than integrated inductors, such as transformer windings (depending, of course, on circumstances such as desired capacitance and inductance). Thus, the circuit area overhead for the addition of the one or more capacitors (compared with the area required for the transformer windings themselves) can normally be kept relatively small. In the embodiment illustrated in FIG. 4, the one or more capacitors is a single capacitor 130a. The capacitor 130a is connected between a pair of taps a1, a2 of the first winding 110. Each tap a1, a2 is located between the first end 112a and the second end 112b along the first winding 110. An inductive sub segment 140a of the first winding 110 is connected in parallel with the capacitor 130a between the taps a1 and a2 of said pair of taps a1, a2. The capacitor 130a, together with the inductive sub segment 140a, forms a parallel LC circuit (where L stands for inductance and C for capacitance). The parallel LC circuit is tuned to resonate at one of said interfering frequencies, thereby suppressing signals at said one of the interfering frequencies.

As is further elucidated with various embodiments below, said one or more capacitors of the transformer filter arrangement 30 may be a plurality of capacitors. Furthermore, more than one of those capacitors may be connected to the first winding 110 in a similar way as the capacitor 130a shown in FIG. 3. Examples of such embodiments are illustrated in FIGS. 5-6.

Figure 5:
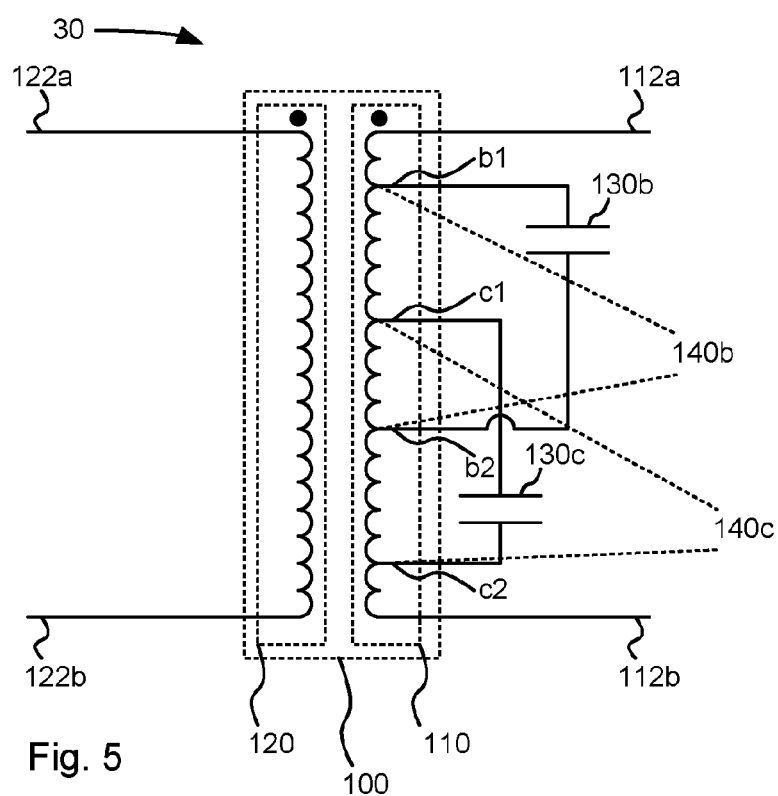

In the embodiment illustrated in FIG. 5, the one or more capacitors are two capacitors; a capacitor 130b and a capacitor 130c. The number two is only an example; other numbers of capacitors may be present in other embodiments. The capacitor 130b is connected between a pair of taps b1, b2 of the first winding 110. Each tap b1, b2 is located between the first end 112a and the second end 112b along the first winding 110. An inductive sub segment 140b of the first winding 110 is connected in parallel with the capacitor 130b between the taps b1 and b2 of said pair of taps b1, b2. The capacitor 130b, together with the inductive sub segment 140b, forms a parallel LC circuit. The parallel LC circuit is tuned to resonate at one of said interfering frequencies, thereby suppressing signals at said one of the interfering frequencies. Similarly, the capacitor 130c is connected between a pair of taps c1, c2 of the first winding 110. Each tap c1, c2 is located between the first end 112a and the second end 112b along the first winding 110. An inductive sub segment 140c of the first winding 110 is connected in parallel with the capacitor 130c between the taps c1 and c2 of said pair of taps c1, c2. The capacitor 130c, together with the inductive sub segment 140c, forms a parallel LC circuit. The parallel LC circuit is tuned to resonate at one of said interfering frequencies, thereby suppressing signals at said one of the interfering frequencies.

Figure 6:
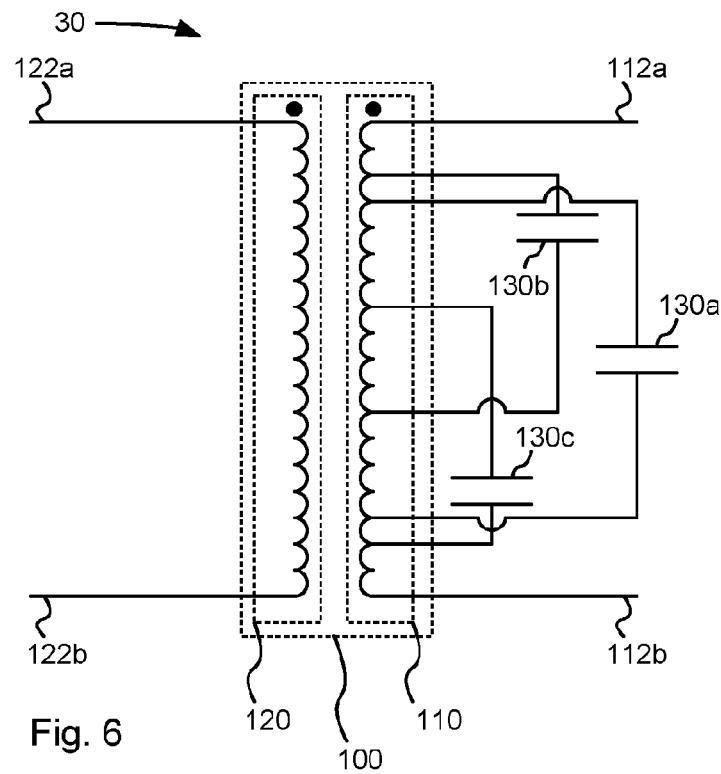

The embodiment illustrated in FIG. 6 is a combination of the embodiments illustrated in FIGS. 4 and 5, and comprises the capacitor 130a connected as in FIG. 4 and the capacitors 130b-c connected as in FIG. 5. For simplicity, the reference signs for the taps a1, a2, b1, b2, c1, and c2, and the inductive sub segments 140a-c have been omitted in FIG. 6.

As is further elucidated with various embodiments below, said one or more capacitors of the transformer filter arrangement 30 may also comprise a number of capacitors connected to the second winding 120 in a similar way as the capacitors 130a-c are connected to the first winding in FIGS. 4-6. An example of such an embodiment is illustrated in FIG. 7.

Figure 7:
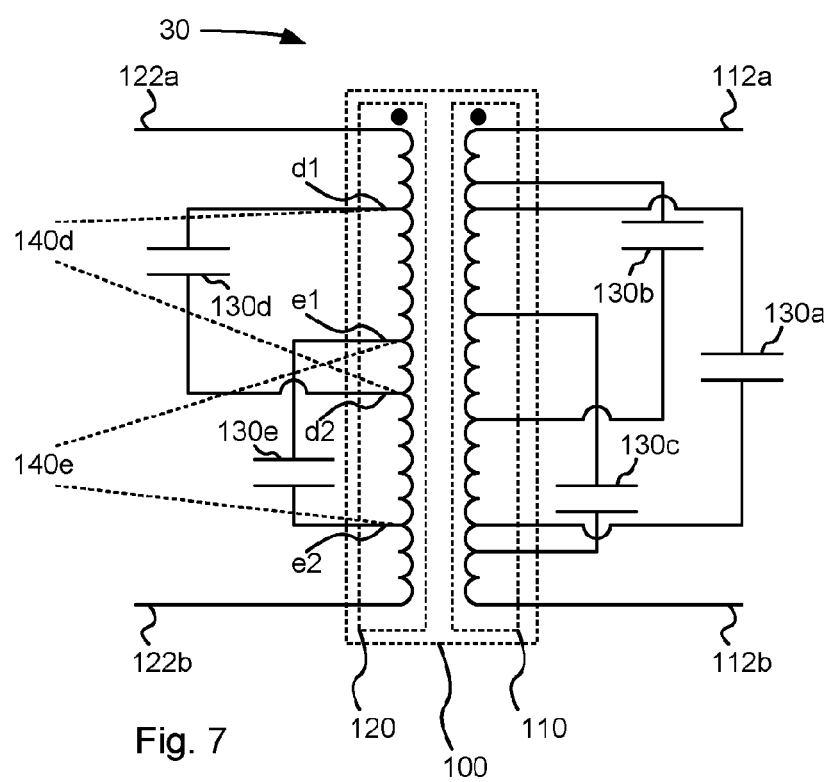

In the embodiment illustrated in FIG. 7, two capacitors 130d-e are connected to the second winding. The number two is only an example; other numbers of capacitors may be present in other embodiments. The capacitor 130d is connected between a pair of taps d1, d2 of the second winding 120. Each tap d1, d2 is located between the first end 122a and the second end 122b along the second winding 120. An inductive sub segment 140d of the second winding 120 is connected in parallel with the capacitor 130d between the taps d1 and d2 of said pair of taps d1, d2. The capacitor 130d, together with the inductive sub segment 140d, forms a parallel LC circuit. The parallel LC circuit is tuned to resonate at one of said interfering frequencies, thereby suppressing signals at said one of the interfering frequencies. Similarly, the capacitor 130e is connected between a pair of taps e1, e2 of the second winding 120. Each tap e1, e2 is located between the first end 122a and the second end 122b along the second winding 120. An inductive sub segment 140e of the second winding 110 is connected in parallel with the capacitor 130e between the taps e1 and e2 of said pair of taps e1, e2. The capacitor 130e, together with the inductive sub segment 140e, forms a parallel LC circuit. The parallel LC circuit is tuned to resonate at one of said interfering frequencies, thereby suppressing signals at said one of the interfering frequencies.

More generally speaking, some embodiments of the present invention are such that, for each capacitor of a first set of at least one capacitor (e.g. 130a-c) of the one or more capacitors (e.g. 130a-e), the capacitor (e.g. 130a-c) is connected between a pair of taps (e.g. a1, a2; b1, b2; c1, c2) of the first winding 110, wherein each tap (e.g. a1, a2, b1, b2, c1, c2) of the pair of taps (e.g. a1, a2; b1, b2; c1, c2) is located between the first end 112a and the second end 112b of the first winding 110 along the first winding 110. Furthermore, some embodiments of the present invention are such that, for each capacitor (e.g. 130a-c) of the first set, the capacitor (e.g. 130a-c), together with an inductive sub segment (e.g. 140a-c) of the first winding 110, which is connected in parallel with the capacitor (e.g. 130a-c) between the pair of taps (e.g. a1, a2; b1, b2; c1, c2), forms a parallel LC circuit which is tuned to resonate at one of said interfering frequencies for suppressing signals at said one of the interfering frequencies. In the embodiments illustrated in FIGS. 4, 5, 6, and 7, the number of capacitors is 1, 2, 3, and 3, respectively. However, these numbers are only examples; the other numbers of capacitors may be comprised in the first set in various embodiments.

Furthermore, e.g. as elucidated with FIG. 6, some embodiments of the present invention are such that, for each capacitor (e.g. 130d-e) of a second set (which is disjoint with the first set) of at least one capacitor of the one or more capacitors (e.g. 130a-e), the capacitor (e.g. 130d-e) is connected between a pair of taps (e.g. d1, d2; e1, e2) of the second winding 120, wherein each tap (e.g. d1, d2, e1, e2) of the pair of taps (e.g. d1, d2; e1, e2) is located between the first end 122a and the second end 122b of the second winding 120 along the second winding 120. Furthermore, some embodiments of the present invention are such that, for each capacitor (e.g. 130d-e) of the second set, the capacitor (e.g. 130d-e), together with an inductive sub segment (e.g. 140d-e) of the second winding 120, which is connected in parallel with the capacitor (e.g. 130d-e) between the pair of taps (e.g. d1, d2; e1, e2), forms a parallel LC circuit which is tuned to resonate at one of said interfering frequencies for suppressing signals at said one of the interfering frequencies.

In some embodiments, e.g. as in FIGS. 4-6, each capacitor (e.g. 130a-c) of the one or more capacitors belongs to the first set. In some embodiments, e.g. as in FIG. 7, each capacitor (e.g. 130a-e) of the one or more capacitors belongs to the union of the first set and the second set.

For each of the one or more interfering frequencies, there may be one or more of the above mentioned parallel LC circuits that are tuned to resonate at that interfering frequency. The term "tuned" in this context includes "static" tuning, i.e. where circuit parameters such as capacitances and inductances are determined and fixated during the design and manufacturing process, as well as "dynamic" tuning where one or more such circuit parameters may be varied during operation; for example, a capacitor with variable capacitance may be implemented using a varactor diode or by using a switched capacitor array where a number of capacitors can be selectively connected in parallel to allow varying the capacitance.

For example, in a radio receiver circuit, so called harmonic down conversion, i.e. that unwanted signal content is down converted by harmonics of a local oscillator (LO) signal into the same band as wanted signal content is down converted to by the fundamental tone of the LO signal, and thereby interferes with said wanted signal content, may pose a problem. The one or more interfering frequencies, for which the transformer filter arrangement 30 is configured to suppress signals, may therefore be or include one or more harmonics of said fundamental frequency, for which the transformer filter arrangement 30 is adapted to pass signals. Thereby, the problems with harmonic down conversion may be reduced. In some embodiments, the transformer filter arrangement may have a notch-filter characteristic with notches at the one or more harmonic frequencies. In case the down conversion mixer used operates on differential signals (e.g. with reference to FIG. 2, if the down conversion mixer is included in the differential processing circuitry 40), it is normally of particular relevance to suppress signals at odd order harmonics of the fundamental frequency, since these, in contrast to signals at the even order harmonics of the fundamental frequency, are not inherently suppressed by the use of differential signal processing. Therefore, in some embodiments, said one or more harmonics of the fundamental frequency may be or include one or more odd order harmonics. Normally, of the odd order harmonics, the third harmonic (for which the frequency is three times the fundamental frequency) may be the most harmful one. For example, the third harmonic of an LO signal is normally the one of the odd order harmonics that has the highest amplitude (consider e.g. a square-wave LO signal). Therefore, in some embodiments, the one or more odd order harmonics included in said one or more harmonics of the fundamental frequency may be or include the third harmonic.

Figure 8:
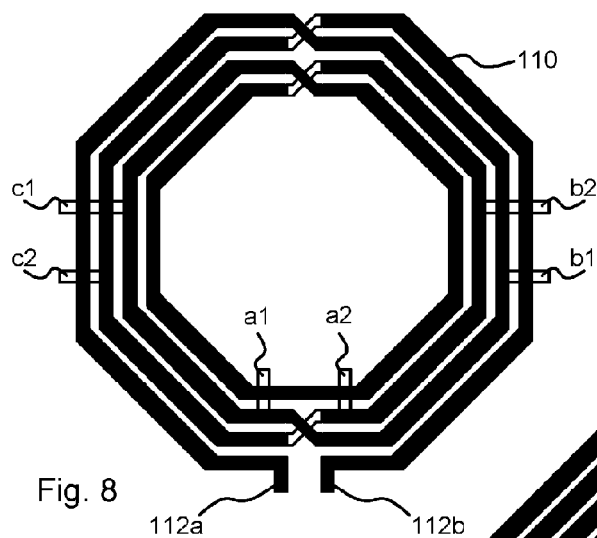
FIGS. 8-10 show circuit layouts of parts of a transformer filter arrangement according to embodiments of the present invention.

FIG. 8 illustrates a possible layout of the first winding 110 according to an embodiment, corresponding to the schematic circuit diagrams in FIGS. 6 and 7. The terminals (or ends) 112a-b of the first winding 110 are indicated at the bottom of FIG. 8. At two places at the top, and at one place at the bottom, the first winding 110 crosses its own path. In the crossings, a solid (or "filled") and an open (or "unfilled") path pattern is used to indicate that different metal layers of the integrated circuit chip are used in this crossing to avoid short circuiting. This convention is used throughout the layout figures. FIG. 8 also elucidates examples of physical placement of the taps a1, a2, b1, b2, c1, c2. In FIG. 8, the taps b1 and b2 is shown to the right, the taps c1 and c2 are shown to the left, and the taps a1 and 2 are shown at the bottom. An open path pattern is used for the taps a1, a2, b1, b2, c1, c2 to indicate that a different metal layer of the integrated circuit chip are used for the taps than for the winding in the crossings between the winding and the taps a1, a2, b1, b2, c1, c2 to avoid short circuiting in the elucidated embodiment. This convention is used throughout the layout figures. For each tap a1, a2, b1, b2, c1, c2, there is a via (not shown), or several vias, that connects the tap to the correct point of the winding in the elucidated embodiment. For the taps b1 and b2 in FIG. 8, the vias are located at the left ends of the taps b1, b2. For the taps c1 and c2 in FIG. 8, the vias are located at the right ends of the taps c1, c2. For the taps a1 and a2 in FIG. 8, the vias are located at the lower ends of the taps a1, a2.

The physical placement of the capacitors (e.g. 130a-e) may be different in different embodiments. For example, in some embodiments, some or all of the capacitors may be placed outside the transformer windings (i.e. outside an outer perimeter, or outside an outer winding turn, of the transformer windings). Furthermore, in some embodiments, some or all of the capacitors may be placed inside the transformer windings (i.e. inside an inner perimeter, or inside an inner winding turn, of the transformer windings). Placing some or all of the capacitors inside the transformer windings has the advantage of further reducing the circuit area overhead required for the capacitors. The most efficient area saving in this context would be achieved if all capacitors are placed inside the transformer windings, since then no circuit area outside the outer perimeter of the transformer windings would be occupied by any of the one or more capacitors of the transformer filter arrangement 30.

The example layout in FIG. 8 illustrates both those types of capacitor placement. The taps b1, b2, c1, and c2 are routed from the respective points of the first winding 110 to the outside of the (outer winding turn of the) first winding 110, thereby facilitating placement of the capacitors 130b and 130c outside the transformer windings. In contrast thereto, the taps a1 and a2 are routed from the respective points of the first winding 110 to the inside of the (inner winding turn of the) first winding 110, thereby facilitating placement of the capacitor 130a inside the transformer windings.

The example layout in FIG. 8 can be modified to correspond to the schematic circuit diagram in FIG. 4 by removing the taps b1, b2, c1, and c2. Similarly, the example layout in FIG. 8 can be modified to correspond to the schematic circuit diagram in FIG. 5 by removing the taps a1 and a2. Hence, no separate figures are provided corresponding to these schematic circuit diagrams.

Figure 9:
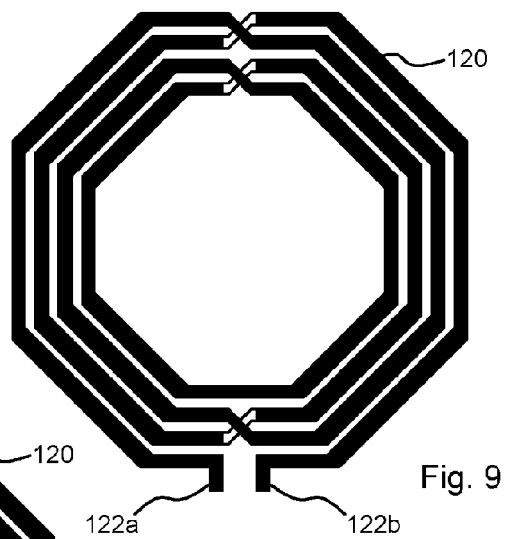

FIG. 9 illustrates a possible layout of the second winding 120 according to an embodiment, corresponding to the schematic circuit diagrams in FIGS. 4 to 6. The terminals (or ends) 122a-b of the second winding 120 are indicated at the bottom of FIG. 9. The layout example in FIG. 9 is similar to that of the first winding 110 in FIG. 8, except that there are no taps in FIG. 9.

Figure 10:
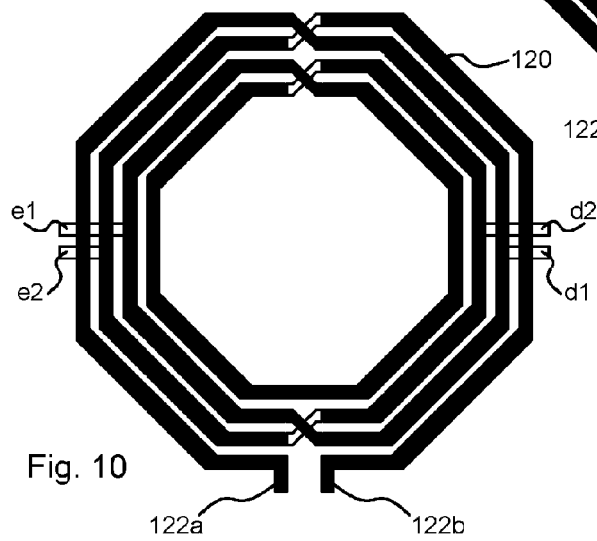

FIG. 10 illustrates a possible layout of the second winding 120 according to an embodiment, corresponding to the schematic circuit diagram in FIG. 7. The layout example in FIG. 10 is similar to that in FIG. 9, with the addition that the taps d1, d2, e1, and e2 are included in FIG. 10.

In the example embodiments illustrated in FIGS. 8-10, the first winding 110 is implemented in metal layer(s) over or under the metal layer(s) in which the second winding 120 is implemented. Note thus that the solid and open path patterns in FIG. 8 do not correspond to the same metal layers as the solid and open path patterns, respectively, in FIGS. 9-10 (if that had been the case, there would have been a short circuit between the first and the second winding 110, 120). In other embodiments, however, the first and the second winding 110, 120 may in fact be implemented in the same metal layer(s) by geometrically interleaving the winding turns of the first and the second winding 110, 120 (and using different metal layers where the windings cross).

In the layout examples provided herein, the terminals 112a-b of the first winding 110 and the terminals 122a-b of the second winding 120 are located in the same place (but in different layers). It should be noted that this is only an example. In other embodiments, the terminals may be placed anywhere. For example, the terminal placement may be based on overall floor plan considerations of the circuit in which the transformer filter arrangement 30 is used, e.g. such that each terminal is located at the same side of the transformer 100 as the component it is to be connected to. The layouts of the first and second windings illustrated herein may for example be rotated with respect to each other, such as but not limited to with an integer multiple of 90°.

Figure 11:
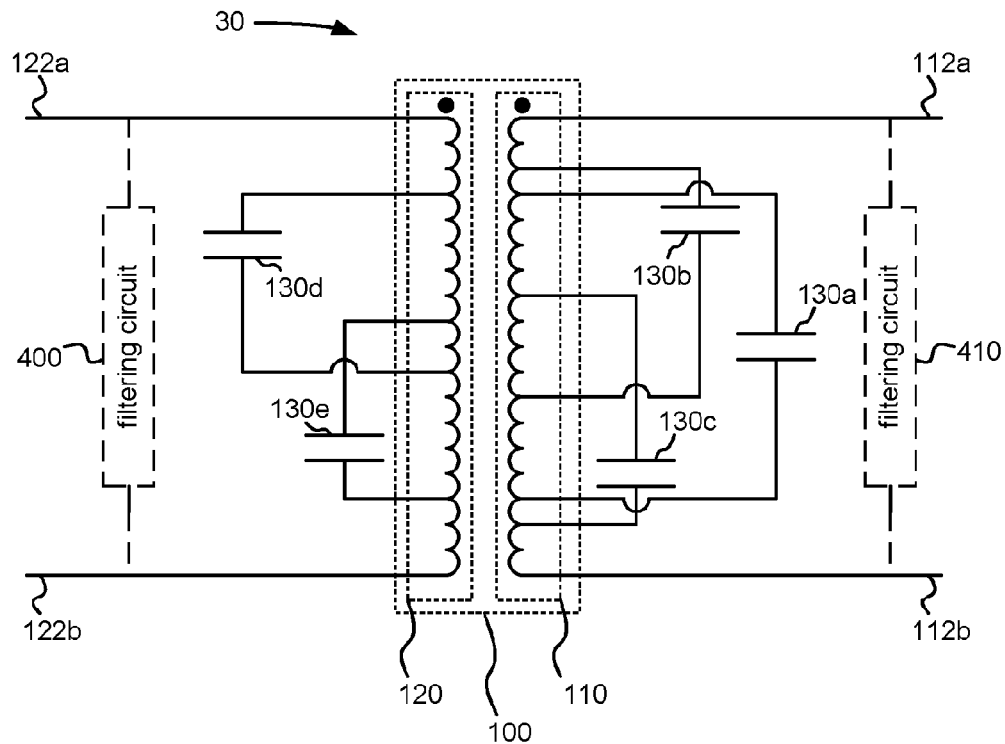
FIG. 11 is a schematic circuit diagram of a transformer filter arrangement according to an embodiment of the present invention.

The filtering performance of the transformer filter arrangement 30 may be further improved by connecting active circuits such as amplifiers, isolation buffers or frequency converters, or passive circuits for further reactive filtering to one or both of the terminals 112a-b of the first winding 110 and/or one or both of the terminals 122a-b of the second winding. This filter chain is illustrated in FIG. 11, showing an optional filtering circuit 400 connected between the terminals 122a and 122b of the second winding 120, and an optional filtering circuit 410 connected between the terminals 112a and 112b of the first winding 110. The filtering circuits 400 and 410 can be either active or passive. In general, the filtering circuits 400 and 410 can be any bandwidth limited physical circuits. In some cases, the active amplifiers, isolation buffers or frequency converters with specific frequency response are used which also reduce the correlation among the filters in the filter chain.

The transformer filter arrangement 30 shown in FIG. 11 can be cascaded together as a multistage structure to perform a enhanced frequency filter operation.

In the example embodiments illustrated in FIGS. 4-11, the one or more capacitors 130a-e are symmetrically connected to the first or second winding 110, 120. Two types of symmetrical connections are illustrated. The capacitor 130a is an example of a single symmetrically connected capacitor, for which the taps (a1 and a2) of the pair of taps it is connected between are located symmetrically around a center of the winding (in this case the first winding 110). The capacitors 130b and 130c is an example of a symmetrically connected pair of capacitors, for which one of the taps (e.g. b1) of a first pair of taps, which is the pair of taps (e.g. b1, b2) between which one of the capacitors (e.g. 130b) of the symmetrically connected pair is connected, and one of the taps (e.g. c2) of a second pair of taps, which is the pair of taps (e.g. c1, c2) between which the other one of the capacitors (e.g. 130c) of the symmetrically connected pair is connected, are located symmetrically around the center of the winding (in this case the first winding 110), and the other one of the taps (e.g. b2) of the first pair of taps and the other one of the taps (e.g. c1) of the second pair of taps are also located symmetrically around the center of the winding (in this case the first winding 110).

The capacitors 130d and 130e is another example of a symmetrically connected pair of capacitors, in this case symmetrically connected to the second winding 120.

Such symmetrically connected capacitors (e.g. single or pair) has the advantage of providing improved signal balancing (i.e. less common-mode variations) compared with a case of non symmetrical connections. In the case of a symmetrically connected pair of capacitors, the best signal balancing properties is obtained if capacitors of the symmetrically connected pair have the same capacitance (within manufacturing tolerances). In the following, the term symmetrically connected pair of capacitors implies that the capacitors of the symmetrically connected pair have the same capacitance (within manufacturing tolerances).

The concept of single symmetrically connected capacitors and symmetrically connected pairs of capacitors can be generalized to symmetrically connected sets of capacitors. The capacitors of such a symmetrically connected set of capacitors are distributed symmetrically along the winding (first or second, as the case may be). In other words, each capacitor of a symmetrically connected set of capacitors is either a single symmetrically connected capacitor or belongs to a symmetrically connected pair of capacitors, for which the other capacitor of the symmetrically connected pair of capacitors is also comprised in the symmetrically connected set of capacitors. Thus, a symmetrically connected set of capacitors may comprise one or more single symmetrically connected capacitors and/or one or more symmetrically connected pairs of capacitors. As for the term symmetrically connected pair, the term symmetrically connected set of capacitors, when used in the following, implies that all capacitors of the symmetrically connected set have the same capacitance (within manufacturing tolerances).

Accordingly, in some embodiments of the present invention, the above mentioned first set of at least one capacitor of the one or more capacitors comprises one or more symmetrically-connected sets of at least one capacitor, wherein, for each such symmetrically-connected set, all capacitors of the symmetrically-connected set have the same capacitance, and the capacitors of the symmetrically connected set are distributed symmetrically along the first winding 110.

Similarly, in some embodiments of the present invention, the above mentioned second set of at least one capacitor of the one or more capacitors comprises one or more symmetrically-connected sets of at least one capacitor, wherein, for each such symmetrically-connected set, all capacitors of the symmetrically-connected set have the same capacitance, and the capacitors of the symmetrically connected set are distributed symmetrically along the second winding 120.

In some embodiments, each of the one or more capacitors (e.g. 130a-e) belongs to a symmetrically-connected set (but not necessarily to the same symmetrically connected set).

Figure 12:
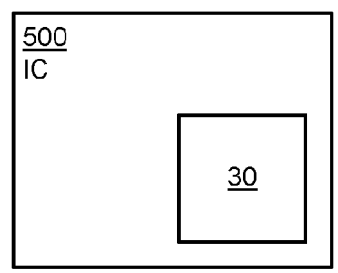
FIG. 12 is a simplified block diagram of an integrated circuit comprising a transformer filter arrangement according to an embodiment of the present invention.

As indicated above, the transformer filter arrangement may in some embodiments be advantageously integrated in an integrated circuit. This is schematically illustrated in FIG. 12, showing a simplified block diagram of an embodiment of an integrated circuit 500 comprising the transformer filter arrangement 30. For example, the integrated circuit 500 may comprise the radio receiver circuit 10 (or parts thereof) and/or the radio transmitter circuit 50 (or parts thereof). Conversely, the integrated circuit 500 may, in some embodiments, be comprised in the radio receiver circuit 10, the radio transmitter circuit 50, and/or a radio communication apparatus such as the mobile telephone 1 or the radio base station 2 (FIG. 1).

To illustrate some benefits of embodiments of the present invention, a comparison with a circuit presented in US 2009/0195324 A1 is presented below. The circuit in US 2009/0195324 A1 comprises a balun transformer, which has a series connection of a capacitor and an inductor connected between a center tap of the balanced-side winding of the balun transformer and ground. In US 2009/0195324 A1, the capacitor and inductor are set to resonate at a resonance frequency equal to a second harmonic frequency. Further analysis of the circuit in US 2009/0195324 A1 reveals that, what this circuit actually does is to suppress common-mode variations at said resonance frequency, but does not perform any "actual" filtering, i.e. it does not remove or suppress any content of the differential signal at the resonance frequency; a balanced input signal, with a frequency equal to said resonance frequency, input on the balanced-side winding of the balun transformer in the circuit of US 2009/0195324 A1 would pass through that circuit unaffected, i.e. in the same way as if said capacitor and inductor had not been present. That can e.g. be realized by considering the fact that for a balanced input signal, without any common-mode variations, the center tap of the balanced-side winding of the balun transformer is a virtual signal ground node (without any voltage variations), so said capacitor and inductor cannot have any influence in the absence of common-mode variations. In contrast thereto, embodiments of the present invention, where capacitors are connected in parallel with the winding sub segments, provides for actual filtering. In differential signals, even-order distortion (such as the second harmonic) often appears as common-mode signals, whereas odd-order distortion often appears as differential signals. In such cases, the circuit in US 2009/0195324 A1 can be useful for suppressing even-order distortion, but not for suppressing odd-order distortion, which would require actual filtering. In contrast thereto, embodiments of the present invention, which performs actual filtering, are capable of suppressing such odd-order distortion appearing as differential signals. It can be noted that, in fact, embodiments of the present invention may be combined with the circuit disclosed in US 2009/0195324 A1 to achieve both filtering and common-mode stabilization.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A transformer filter arrangement for passing signals at a fundamental frequency and suppressing signals at one or more interfering frequencies, for use in a receiver circuit or a transmitter circuit, the transformer filter arrangement comprising:
   a transformer having a first winding and a second winding formed by conducting and isolating layers of a chip or printed circuit board, wherein the first winding has a first end and a second end and the second winding has a first end and a second end, wherein the transformer filter arrangement is a balun arrangement and the transformer is a balun transformer; and
   one or more capacitors,
      wherein at least one capacitor of the one or more capacitors is connected between a pair of taps of the first winding, wherein each tap of the pair of taps is located between the first end and the second end of the first winding, and
      wherein the at least one capacitor of the one or more capacitors is connected in parallel with an inductive sub segment of the first winding, to form a parallel LC circuit that is tuned to resonate at one of said interfering frequencies, for suppressing signals at said one of the interfering frequencies.

2. The transformer filter arrangement according to claim 1, wherein the at least one capacitor of the one or more capacitors comprises one or more symmetrically-connected sets of at least one capacitor, wherein, for each such symmetrically-connected set:
   all capacitors of the symmetrically-connected have the same capacitance; and
   each single capacitor of the symmetrically-connected set is symmetrically connected to the first winding with respect to a center of the first winding or each pair of one or more pairings of capacitors in the symmetrically-connected set is symmetrically connected to the first winding with respect to the center of the first winding.

3. The transformer filter arrangement according to claim 1, wherein said one or more interfering frequencies include one or more harmonics of the fundamental frequency.

4. The transformer filter arrangement according to claim 3, wherein the one or more harmonics of the fundamental frequency include one or more odd order harmonics.

5. The transformer filter arrangement according to claim 4, wherein the one or more odd order harmonics include a third harmonic.

6. The transformer filter arrangement according to claim 3, wherein the transformer filter arrangement has a notch-filter characteristic with notches at the one or more harmonics of the fundamental frequency.

7. A radio communication apparatus comprising the transformer filter arrangement according to claim 1.

8. The radio communication apparatus according to claim 7, wherein the radio communication apparatus is one of a wireless data modem, a mobile telephone, and a radio base station.

9. A transformer filter arrangement for passing signals at a fundamental frequency and suppressing signals at one or more interfering frequencies, for use in a receiver circuit or a transmitter circuit, the transformer filter arrangement comprising:
   a transformer having a first winding and a second winding formed by conducting and isolating layers of a chip or printed circuit board, wherein the first winding has a first end and a second end and the second winding has a first end and a second end;
   one or more filtering circuits connected to one or more ends of at least one of the first winding and the second winding; and
   one or more capacitors,
      wherein at least one capacitor of the one or more capacitors is connected between a pair of taps of the first winding, wherein each tap of the pair of taps is located between the first end and the second end of the first winding, and
      wherein the at least one capacitor of the one or more capacitors is connected in parallel with an inductive sub segment of the first winding, to form a parallel LC circuit that is tuned to resonate at one of said interfering frequencies, for suppressing signals at said one of the interfering frequencies.

10. The transformer filter arrangement according to claim 9, wherein the at least one capacitor of the one or more capacitors comprises one or more symmetrically-connected sets of at least one capacitor, wherein, for each such symmetrically-connected set:
   all capacitors of the symmetrically-connected set have the same capacitance; and
   each single capacitor of the symmetrically-connected set is symmetrically connected to the first winding with respect to a center of the first winding or each pair of one or more pairings of capacitors in the symmetrically-connected set is symmetrically connected to the first winding with respect to the center of the first winding.

11. The transformer filter arrangement according to claim 9, wherein said one or more interfering frequencies include one or more harmonics of the fundamental frequency.

12. The transformer filter arrangement according to claim 11, wherein the one or more harmonics of the fundamental frequency include one or more odd order harmonics.

13. The transformer filter arrangement according to claim 12, wherein the one or more odd order harmonics include a third harmonic.

14. The transformer filter arrangement according to claim 11, wherein the transformer filter arrangement has a notch-filter characteristic with notches at the one or more harmonics of the fundamental frequency.

15. A radio communication apparatus comprising the transformer filter arrangement according to claim 9.

16. The radio communication apparatus according to claim 15, wherein the radio communication apparatus is one of a wireless data modem, a mobile telephone, and a radio base station.

17. A transformer filter arrangement for passing signals at a fundamental frequency and suppressing signals at one or more interfering frequencies, for use in a receiver circuit or a transmitter circuit, the transformer filter arrangement comprising:
 a transformer having a first winding and a second winding formed by conducting and isolating layers of a chip or printed circuit board, wherein the first winding has a first end and a second end and the second winding has a first end and a second end; and
 one or more capacitors, wherein the one or more capacitors comprises at least one of:
  a capacitor symmetrically connected to the first winding with respect to a center of the first winding; and
  a pair of capacitors connected to the first winding at respective positions that are symmetrical with respect to the center of the first winding,
  wherein at least one capacitor of the one or more capacitors is connected between a pair of taps of the first winding, wherein each tap of the pair of taps is located between the first end and the second end of the first winding; and
  wherein the at least one capacitor of the one or more capacitors is connected in parallel with an inductive sub segment of the first winding, to form a parallel LC circuit that is tuned to resonate at one of said interfering frequencies, for suppressing signals at said one of the interfering frequencies.

18. A radio communication apparatus comprising the transformer filter arrangement according to claim 17.

19. The radio communication apparatus according to claim 18, wherein the radio communication apparatus is one of a wireless data modem, a mobile telephone, and a radio base station.

20. A transformer filter arrangement for passing signals at a fundamental frequency and suppressing signals at one or more interfering frequencies, for use in a receiver circuit or a transmitter circuit, the transformer filter arrangement comprising:
 a transformer having a first winding and a second winding formed by conducting and isolating layers of a chip or printed circuit board, wherein the first winding has a first end and a second end and the second winding has a first end and a second end; and
 a first set of a plurality of capacitors,
  wherein each capacitor of the first set of the plurality of capacitors is connected between a pair of taps of the first winding, wherein each tap of the pair of taps is located between the first end and the second end of the first winding, and
  wherein each capacitor of the first set of the plurality of capacitors is connected in parallel with an inductive sub segment of the first winding, to form a parallel LC circuit that is tuned to resonate at one of said interfering frequencies, for suppressing signals at said one of the interfering frequencies.

21. A radio communication apparatus comprising the transformer filter arrangement according to claim 20.

22. The radio communication apparatus according to claim 21, wherein the radio communication apparatus is one of a wireless data modem, a mobile telephone, and a radio base station.

23. The transformer filter arrangement according to claim 20, further comprising a second set of at least one capacitor:
 wherein each capacitor of the second set of the at least one capacitor is connected between a pair of taps of the second winding, wherein each tap of the pair of taps is located between the first end and the second end of the second winding,
 wherein each capacitor is connected in parallel with an inductive sub segment of the second winding, to form a parallel LC circuit that is tuned to resonate at another one of said interfering frequencies, for suppressing signals at said other one of the interfering frequencies, and
 wherein the first set of the plurality of capacitors and the second set of the at least one capacitor are disjoint.

24. The transformer filter arrangement according to claim 23, wherein the second set of the at least one capacitor comprises one or more symmetrically-connected sets of at least one capacitor, wherein, for each such symmetrically-connected set:
 all capacitors of the symmetrically-connected set have the same capacitance; and
 each single capacitor of the symmetrically-connected set is symmetrically connected to the second winding with respect to a center of the second winding or each pair of one or more pairings of capacitors in the symmetrically-connected set is symmetrically connected to the second winding with respect to the center of the first winding.

25. The transformer filter arrangement according to claim 20, wherein the first set of a plurality of capacitors comprises one or more symmetrically-connected sets of at least one capacitor, wherein, for each such symmetrically-connected set:
 all capacitors of the symmetrically-connected set have the same capacitance; and
 each single capacitor of the symmetrically-connected set is symmetrically connected to the first winding with respect to a center of the first winding or each pair of one or more pairings of capacitors in the symmetrically-connected set is symmetrically connected to the first winding with respect to the center of the first winding.

26. The transformer filter arrangement according to claim 20, wherein said one or more interfering frequencies include one or more harmonics of the fundamental frequency.

27. The transformer filter arrangement according to claim 26, wherein the one or more harmonics of the fundamental frequency include one or more odd order harmonics.

28. The transformer filter arrangement according to claim 27, wherein the one or more odd order harmonics include a third harmonic.

29. The transformer filter arrangement according to claim 26, wherein the transformer filter arrangement has a notch-filter characteristic with notches at the one or more harmonics of the fundamental frequency.

* * * * *